(12) United States Patent
Kim et al.

(10) Patent No.: US 11,895,768 B2
(45) Date of Patent: Feb. 6, 2024

(54) PRINTED CIRCUIT BOARD SUBSTRATE COMPRISING A COATED BORON NITRIDE

(71) Applicant: ROGERS CORPORATION, Chandler, AZ (US)

(72) Inventors: Eui Kyoon Kim, Acton, MA (US); Bruce Fitts, Phoenix, AZ (US); Christopher Brown, Natick, MA (US)

(73) Assignee: ROGERS CORPORATION, Chandler, AZ (US)

( * ) Notice: Subject to any disclaimer, the term of this patent is extended or adjusted under 35 U.S.C. 154(b) by 53 days.

(21) Appl. No.: 17/641,548

(22) PCT Filed: Oct. 2, 2019

(86) PCT No.: PCT/US2019/054173
§ 371 (c)(1),
(2) Date: Mar. 9, 2022

(87) PCT Pub. No.: WO2020/072566
PCT Pub. Date: Apr. 9, 2020

(65) Prior Publication Data
US 2022/0322517 A1 Oct. 6, 2022

Related U.S. Application Data

(60) Provisional application No. 62/740,083, filed on Oct. 2, 2018.

(51) Int. Cl.
*H05K 1/02* (2006.01)
*H05K 1/03* (2006.01)
(Continued)

(52) U.S. Cl.
CPC ......... *H05K 1/0204* (2013.01); *C23C 16/403* (2013.01); *C23C 16/45525* (2013.01);
(Continued)

(58) Field of Classification Search
CPC .............................................. H05K 2201/0209
See application file for complete search history.

(56) References Cited

U.S. PATENT DOCUMENTS 3,956,041 A * 5/1976 Polichette ............... B29C 63/48
427/306
4,289,720 A 9/1981 Yajima et al.
(Continued)

FOREIGN PATENT DOCUMENTS

JP 2014055303 A 3/2014
JP 5988164 B2 9/2016
(Continued)

OTHER PUBLICATIONS

Ferguson et al.'s "Atomic Layer Deposition of SiO2 Films on BN Particles Using Sequential Surface Reactions," Chem. Mater. 2000, 12, 3472-3480 (Year: 2000).*
(Continued)

*Primary Examiner* — Ian A Rummel
(74) *Attorney, Agent, or Firm* — CANTOR COLBURN LLP (57) ABSTRACT

In an embodiment, a printed circuit board substrate (12) comprises a polymer matrix; a reinforcing layer (42); and a plurality of coated boron nitride particles (44); wherein the plurality of coated boron nitride particles comprise a coating having an average coating thickness of 1 to 100 nanometers. The polymer matrix can comprise at least one of an epoxy, a polyphenylene ether, polystyrene, an ethylene-propylene dicyclopentadiene copolymer, a polybutadiene, a polyisoprene, a fluoropolymer, or a crosslinked matrix comprising at least one of triallyl cyanurate, triallyl isocyanurate, 1,2,4-trivinyl cyclohexane, trimethylolpropane triacrylate, or trimethylolpropane trimethacrylate.

21 Claims, 3 Drawing Sheets (51) Int. Cl.
*C23C 16/455* (2006.01)
*C23C 16/40* (2006.01)

(52) U.S. Cl.
CPC ......... *H05K 1/0366* (2013.01); *H05K 1/0373* (2013.01); *H05K 2201/0209* (2013.01); *H05K 2201/0227* (2013.01); *H05K 2201/0293* (2013.01)

(56) References Cited

U.S. PATENT DOCUMENTS

| | | |
|---|---|---|
| 4,321,100 A | 3/1982 | Dubuske |
| 5,153,295 A | 10/1992 | Whitmarsh et al. |
| 5,571,609 A | 11/1996 | St. Lawrence et al. |
| 5,898,009 A | 4/1999 | Shaffer et al. |
| 5,972,811 A | 10/1999 | St. Lawrence et al. |
| 6,048,511 A | 4/2000 | Shaffer et al. |
| 6,071,836 A | 6/2000 | St. Lawrence et al. |
| 6,147,243 A | 11/2000 | Onodera et al. |
| 6,291,374 B1 | 9/2001 | Landi |
| 6,312,621 B1 | 11/2001 | Pedigo et al. |
| 6,322,621 B1 | 11/2001 | Pedigo et al. |
| 6,586,533 B1 | 7/2003 | Landi et al. |
| 6,613,383 B1 | 9/2003 | George et al. |
| 6,713,177 B2 | 3/2004 | George et al. |
| 6,913,827 B2 | 7/2005 | George et al. |
| 6,951,583 B2 | 10/2005 | Clere et al. |
| 8,875,813 B2 | 11/2014 | Zhan et al. |
| 9,546,424 B2 | 1/2017 | King et al. |
| 2002/0123285 A1 | 9/2002 | Dana et al. |
| 2003/0026989 A1 | 2/2003 | George et al. |
| 2005/0041373 A1 | 2/2005 | Pruss et al. |
| 2007/0093587 A1 | 4/2007 | Shen et al. |
| 2016/0276072 A1 | 9/2016 | Sethumadhavan et al. |
| 2017/0022600 A1 | 1/2017 | King et al. |
| 2017/0022608 A1 | 1/2017 | King et al. |
| 2017/0055339 A1* | 2/2017 | Zhang ................. H05K 1/0373 |
| 2017/0145266 A1 | 5/2017 | Scholz |

FOREIGN PATENT DOCUMENTS

| | | |
|---|---|---|
| JP | 2017128662 A | 7/2017 |
| KR | 20180007551 A | 1/2018 |
| WO | 03008186 A1 | 1/2003 |
| WO | 2008036657 A1 | 3/2008 |
| WO | 2008036662 A2 | 3/2008 |
| WO | 2008130894 A1 | 10/2008 |
| WO | 2010141432 A1 | 12/2010 |
| WO | 2018093987 A1 | 5/2018 |

OTHER PUBLICATIONS

"Growth mode of alumina atomic layer deposition on nanopowders," Manandhar et al., Journal of Vacuum Science & Technology A 35, 041503 (2017) (Year: 2017).*

Ferguson et al., "Atomic layer deposition of Al2O3 and SiO2 on BN particles using sequential surface reactions," Aug. 1, 2000, Applied Surface Science vol. 162-163, pp. 280-292.

Ferguson et al., "Atomic layer deposition of ultrathin and conformal Al2O3 films on BN particles," 2000, This Solid Films, 371, pp. 95-104.

Hill et al., "Thermally Conductive Dieletrics without Halogens or Phosphorous," (2006), OnBoard Technology, pp. 8-11.

International Search Report; International Application No. PCT/US2019/054173; International Filing Date: Oct. 2, 2019;dated Jan. 24, 2020; 6 pages.

Liu et al., "The integration of high-k dielectric on two-dimensional crystals by atomic layer deposition," 2012, Appl. Phys. Lett. 100, 152115. pp. 1-4.

Wank et al., "Nanocoating individual cohesive boron nitride particles in a fluidized bed by ALD," (2004) Powder Technology, vol. 142, pp. 59-69.

Written Opinion; International Application No. PCT/US2019/054173; International Filing Date: Oct. 2, 2019; dated Jan. 24, 2020; 7 pages.

* cited by examiner

PRINTED CIRCUIT BOARD SUBSTRATE COMPRISING A COATED BORON NITRIDE

CROSS REFERENCE TO RELATED APPLICATIONS

This application is a National Stage application of PCT/US2019/054173, filed Oct. 2, 2019, which claims the benefit of U.S. Provisional Patent Application Ser. No. 62/740,083 filed Oct. 2, 2018, both of which are incorporated by reference in their entirety herein.

BACKGROUND

Disclosed herein is a printed circuit board substrate, methods for making the printed circuit board substrate.

Circuit designs for electronic devices such as televisions, radios, computers, medical instruments, business machines, communications equipment, and the like have become increasingly smaller and thinner. The increasing power of such electronic components has resulted in increasing heat generation. Moreover, smaller electronic components are being densely packed into ever smaller spaces, resulting in more intense heat generation with increased hot-spot temperatures. At the same time, temperature-sensitive elements in electronic devices may need to be maintained within a prescribed operating temperature in order to avoid significant performance degradation or even system failure.

In this context, printed circuit board substrates have been developed to facilitate effective heat dissipation. In general, these printed circuit board substrates are based on composites, such as thermoset polymers that contain thermally conductive particles. For example, epoxies are some of the most widely used thermoset polymers in the art, owing to their good adhesive properties and processability. Epoxies themselves, however, have a relatively low thermal conductivity and, therefore do not dissipate the heat generated in advanced microelectronic devices effectively. Consequently, thermally conductive materials such as aluminum nitride (AlN), boron nitride (BN), aluminum oxide ($Al_2O_3$) or silicon carbide (SiC) are usually incorporated in the polymers to achieve effective heat dissipation.

Although adding such thermally conductive materials has been shown to effect increases in the thermal conductivity of various printed circuit board substrates, these filled materials often experience at least one of a reduction in mechanical properties, a reduction in peel strength, or a long-term issues with thermal aging. It would be particularly advantageous if a printed circuit board substrate were developed that could be easily processable, possessed improved mechanical/adhesive properties over current thermal interfaces, or provided an improved heat transfer efficiency.

BRIEF SUMMARY

Disclosed herein is a printed circuit board substrate, methods for making the printed circuit board substrate.

In an embodiment, the printed circuit board substrate comprises a polymer matrix; a reinforcing layer; and a plurality of coated boron nitride particles; wherein the plurality of coated boron nitride particles comprise a coating having an average coating thickness of 0.1 to 100 nanometers A method of making the printed circuit board substrate comprises forming a mixture comprising a thermosetting composition and the plurality of the coated boron nitride particles; and curing the thermosetting composition to form the printed circuit board substrate.

The above described and other features are exemplified by the following figures, detailed description, and claims.

BRIEF DESCRIPTION OF THE DRAWINGS

The following Figures are exemplary embodiments, which are provided to illustrate the present disclosure. The figures are illustrative of the examples, which are not intended to limit devices made in accordance with the disclosure to the materials, conditions, or process parameters set forth herein.

DETAILED DESCRIPTION

Although adding thermally conductive particles such as boron nitride to polymer composites has been shown to increase the thermal conductivity, many of these thermally conductive particles have been shown to result in a significant decrease in copper peel strength with increased filler loading. This reduction in copper peel strength with increasing filler load arises due to the exceptionally low surface energy of boron nitride, its relatively inert surface chemistry resulting in a lack of chemical bonding sites, and its topography of smooth basal planes resulting in an apparent lack of opportunities for chemical bonding or mechanical interlocking sites between the boron nitride and its surrounding matrix. Practically, these features combined result in adhesive failure between the boron nitride particles and the polymer, empirically resulting in the boron nitride acting as a void in the polymer composite.

Is was discovered that a printed circuit board substrate comprising a plurality of coated boron nitride particles, having an average coating thickness of 0.1 to 100 nanometers (nm) can result in a printed circuit board substrate having an improved peel strength. For example, the peel strength between the printed circuit board substrate and a conductive layer can be greater than or equal to 3 pounds per linear inch (pli) [0.54 kilograms per linear centimeter (kg/cm)] as measured by IPC-TM-650-2.4.8. The printed circuit board substrate can surprisingly retain at a minimum 90%, or 90 to 99% of the Z-direction thermal conductivity compared to an otherwise similar printed circuit board substrate prepared from the plurality of boron nitride particles without the coating. "Z-direction thermal conductivity" refers to thermal conductivity in the direction perpendicular to the plane of the dielectric substrate layer. The disclosed printed circuit board substrate can help to overcome thermal management challenges in designing multi-layer circuits striving for further component miniaturization and integration, and higher operating frequencies. The Z-direction thermal conductivity can be at least 0.8 Watts per meter per Kelvin (W/mK), as measured by ASTM D5470-17, TIM Tester 1300. The printed circuit board can have a water absorption of less than or equal to 0.15 wt %, or 0.01 to 0.1 wt % based on the total weight of the sample when measured in accordance with ASTM D570-98(2018).

Figure 1:
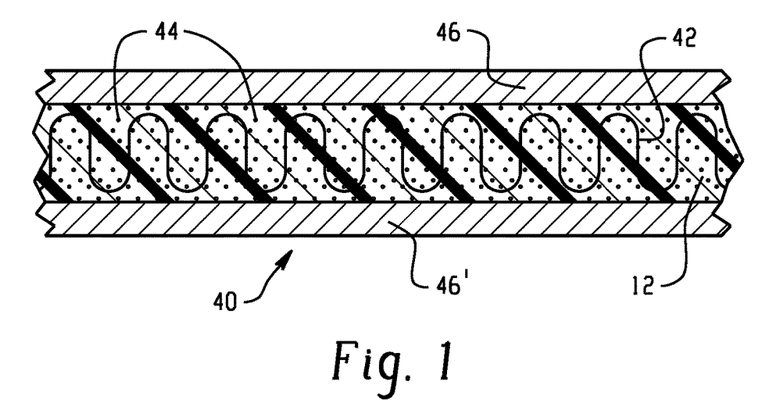
FIG. 1 is a cross-sectional illustration of an embodiment of a circuit material comprising the printed circuit board substrate.

FIG. 1 is a cross-sectional illustration of a circuit material 40 comprising a printed circuit board substrate 12 located in between a first conductive layer 46 and a second conductive layer 46'. It is to be understood that in all of the embodiments described herein, the various layers can fully or partially cover each other, and additional copper foil layers, patterned circuit layers, and substrate layers can also be present. It is also understood that the various layers can be in direct physical contact with neighboring layers (directly on) or layers such as adhesive layers can be located there between (on). The printed circuit board substrate 12 comprises a plurality of the coated boron nitride particles 44 and a reinforcing layer 42.

The plurality of coated boron nitride particles can comprise one or both of single particles (primary particles) or agglomerates (secondary particles) containing a plurality of particles. The plurality of coated boron nitride particles (the primary particles or agglomerates of particles) can have an average particle size of 0.1 to 1,000 micrometers, or 5 to 500 micrometers, or 10 to 250 micrometers, or 25 to 150 micrometers, or 500 nanometers to 100 micrometers, or 3 to 40 micrometers. The plurality of coated boron nitride particles can comprise irregularly shaped hexagonal boron nitride platelets, having an average particle size of greater than or equal to 10 micrometers. "Particle size" as used herein can refer to the mean diameter or equivalent diameter as best determined by standard laser particle measurement. The particle size can refer to the $D_{50}$ particle size that is known as the median diameter or the median value of the particle size distribution; it is the value of the particle diameter at 50% in the cumulative distribution.

The plurality of coated boron nitride particles can be in the form of at least one of a powder (which includes flakes, platelets, and other shapes), fibers, rods, whiskers, sheets, nanosheets, agglomerates, or boron nitride nanotubes (BNNT), and can vary as to crystalline type, shape, or size, and including a distribution of the foregoing. The plurality of coated boron nitride particles can have an average aspect ratio (the ratio of width or diameter to length of a particle) of 1:2 to 1:100,000, or 1:5 to 1:1,000, or 1:10 to 1:300. Exemplary shapes of particles having particularly high aspect ratios include platelets, rod-like particles, fibers, whiskers, and the like. The plurality of coated boron nitride particles can comprise coated boron nitride platelets. The exact shape of the platelets is not critical. In this regard, the coated boron nitride platelets can have irregular shapes. It is noted the term "platelets" as used herein is generally descriptive of any thin, flattened particles, inclusive of flakes. The platelets can have an average aspect ratio (the ratio of width to length of a particle) of 4:5 to 1:300, or 1:2 to 1:300, or 1:2 to 1:200, or 3:5 to 1:100, or 1:25 to 1:100.

Regarding crystalline type, the coated boron nitride particles can comprise at least one structure that is hexagonal, cubic, wurtzite, rhombohedral, or other synthetic structure. Among the various structures, boron nitride particles of hexagonal structure (hBN) can obtain superior thermal conductivity of, for example, 10 to 300 watts per meter Kelvin (W/mK) or more, and particles of cubic structure can obtain an extremely high thermal conductivity of 1,300 W/mK maximum. The thermal conductivity of the boron nitride particles can be determined in accordance with ASTM E1225-13. Hexagonal boron nitride has a layered structure, analogous to graphite, in which the layers are stacked in registration such that the hexagonal rings in layers coincide. The positions of N and B atoms alternate from layer to layer.

The plurality of coated boron nitride particles can have a hexagonal structure with a crystallization index of at least 0.12, or 0.20 to 0.55, or 0.30 to 0.55. The hBN particles can be obtained from a variety of commercial sources.

Boron nitride particles, crystalline or partially crystalline, can be made by processes known in the art. These include, for example, boron nitride powder produced from the pressing process disclosed in U.S. Pat. Nos. 5,898,009 and 6,048,511, the boron nitride agglomerated powder disclosed in U.S. Patent Publication No. 2005/0041373, and the highly delaminated boron nitride powder disclosed in U.S. Pat. No. 6,951,583. A variety of boron nitride powders are commercially available, for example, from Momentive under the trade name POLARTHERMA boron nitride.

The plurality of coated boron nitride particles comprises a coating. The coating can comprise at least one of carbon, aluminum, silicon, germanium, copper, nickel, palladium, platinum, iridium, cobalt, iron, ruthenium, molybdenum, tungsten, tantalum, zirconium, or titanium, for example, in the form of at least one of a carbide, an oxide, a nitride, a sulfide, or a phosphide. The coating can comprise at least one of an inorganic carbide (such as aluminum carbide or titanium carbide), an inorganic oxide (such as aluminum oxide ($Al_2O_3$), magnesium oxide, silicon dioxide ($SiO_2$), titanium dioxide, yttria oxide, zirconium oxide, or zinc oxide), an inorganic nitride (such as aluminum nitride (AlN) or silicon nitride), an inorganic sulfide (such as gallium sulfide, molybdenum sulfide, or tungsten sulfide), an inorganic hydroxide (such as aluminum hydroxide ($Al_xO_yH_z$), zinc hydroxide ($Zn_xO_yH_z$), or silicon hydroxide ($Si_xO_yH_z$)), or an inorganic phosphide. The coating can comprise at least one of silicon dioxide or aluminum oxide.

The coating can comprise one or more distinct coating layers that can optionally be alternating layers. For example, the coating can comprise a first coating layer comprising aluminum oxide and a second coating layer comprising aluminum nitride. In another example, the coating can comprise a first coating layer comprising aluminum oxide and a second coating layer comprising silicon dioxide. Prior to depositing a silicon dioxide layer by atomic layer deposition (ALD), it can be beneficial to first coat the plurality of boron nitride particles with aluminum oxide as the aluminum oxide tends to deposit much more uniformly than silicon dioxide onto both the basal planes and edges of the boron nitride particles and can thereafter serve as a seed layer for depositing the silicon dioxide.

The coating can be disposed over 10 to 100 area percent (A %), or 50 to 100 A %, or 90 to 100 A % of the surface. The coating can have a thickness of 0.1 to 100 nm, or 0.5 to 30 nm, or 1 to 20 nm, or less than or equal to 5 nm. The coating can have a thickness of 0.5 to 100 nm, or 1 to 10 nm. The plurality of coated boron nitride particles can comprise less than 1 weight percent (wt %), or 0.001 to 0.9 wt %, or 0.001 to 0.5 wt %, or 0.005 to 0.1 wt % of the coating based on the total weight of the plurality of coated boron nitride particles.

The plurality of coated boron nitride particles can be further surface treated with a coupling agent. Coupling agents promote the formation of or participate in covalent bonds that improve adhesion between the filler and the thermoset polymer matrix. Exemplary coupling agents include silanes, zirconates, titanates, and the like, such as vinyltrichlorosilane, vinyltrimethoxysilane, trivinylmethoxysilane, vinyltriethoxysilane, vinyltris(β-methoxyethoxy)silane, β-(3,4-epoxycyclohexyl)ethyltrimethoxysilane, γ-glycidoxypropyltrimethoxysilane, γ-glycidoxypropylmethyldiethoxysilane, γ-glycidoxypropyltriethoxysilane, γ-methacryloxypropylmethyldimethoxysilane, γ-methacryloxypropyltrimethoxysilane, γ-methacryloxypropylmethyldiethoxysilane, γ-methacryloxypropyltriethoxysilane, N-β(aminoethyl)γ-aminopropylmethyldimethoxysilane, N-β(aminoethyl)γ-aminopropyltrimethoxysilane, bis(trimethoxysilylethyl)benzene, bis(triethoxysilyl)ethylene, triethoxysilyl-modified butadiene, styrylethyltrimethyloxysilane, N-β(aminoethyl) γ-aminopropyltriethoxysilane, γ-aminopropyltrimethoxysilane, γ-aminopropyltriethoxysilane, N-phenyl-γ-aminopropyltrimethoxysilane, trimethoxyphenylsilane, perfluorocotyltriethoxysilane, and γ-mercaptopropyltrimethoxysilane.

The coating can be applied to the plurality of boron nitride particles via ALD. ALD is a type of chemical vapor deposition, in which a thin film is deposited onto a substrate using gas phase chemical precursors, which react at the substrate surface. For example, a silicon dioxide coating can be deposited by alternating exposures of the boron nitride particles to $SiCl_4$ and $H_2O$ and an aluminum oxide coating can be deposited by alternating exposures of $Al(CH_3)_3$ and $H_2O$. A convenient method for applying the ultrathin coating of the inorganic material to the plurality of boron nitride particles is to form a fluidized bed of the particles, and then pass the various reagents in turn through the fluidized bed under reaction conditions. Methods of fluidizing particulate materials are well known, and generally include supporting the particles on a porous plate or screen. A fluidizing gas can then be passed upwardly through the plate or screen, lifting the particles somewhat and expanding the volume of the bed. With appropriate expansion, the particles behave much as a fluid. Fluid (gaseous or liquid) reagents can be introduced into the bed for reaction with the surface of the particles. The method of applying the coating of the inorganic material can comprise conducting the coating reaction in a rotating reactor in order to distribute individual particles evenly and expose all particles to the reactants. If desired, multiple layers of ultrathin coatings can be deposited on the plurality of coated boron nitride particles. The multiple layers can be deposited to provide layers with different compositions, for example, to provide alternating compositions.

After an inorganic coating has been formed, one or more reactions can be conducted on the coating thus formed in order to modify the coating. This technique is useful for creating ultrathin coatings of various types that are not amenable to deposition using atomic layer deposition techniques. For example, various types of ultrathin oxide coatings can be formed using the atomic layer deposition techniques described above, and then can be carburized to convert the oxide to the corresponding carbide or nitride to convert the oxide to the corresponding nitride.

Before or after the coating treatment, the boron nitride particles can be thermally treated. The thermal treatment can comprise heating the boron nitride particles at a temperature of 100 to 250 degrees Celsius (° C.), or 150 to 200° C., for example, for greater than 4 hours, or 6 to 10 hours. The thermal treatment can comprise heating the boron nitride particles at a temperature of 500 to 1,500° C., for example, for 4 to 18 hours, or 6 to 10 hours. The thermal treatment can be performed in the presence of air, an inert atmosphere, or a vacuum.

A printed circuit board substrate can comprise 1 to 85 volume percent (vol %), or 25 to 80 vol %, or 40 to 60 vol % of the plurality of coated boron nitride particles based on the total volume of the printed circuit board substrate. A printed circuit board substrate can comprise 1 to 50 vol %, or 5 to 35 vol %, or 10 to 25 vol % of the plurality of coated boron nitride particles based on the total volume of the printed circuit board substrate. The printed circuit board substrate can comprise 15 to 99 vol %, or 50 to 99 vol %, or 65 to 95 vol %, or 75 to 80 vol % of the thermoset polymer matrix based on the total volume of the printed circuit board substrate. The printed circuit board substrate can be free of a void space.

The printed circuit board substrate can optionally include a reinforcing layer, for example, a fibrous layer comprising a plurality of thermally stable fibers. The reinforcing layer can be a fabric reinforcement. The fibrous layer can be woven or non-woven, such as a felt. The reinforcing layer can reduce shrinkage of the printed circuit board substrate upon cure within the plane of the material. In addition, the use of the reinforcing layer can help render the material with a relatively high mechanical strength. Such materials can be more readily processed by methods in commercial use, for example, lamination, including roll-to-roll lamination. The thermally stable fibers can comprise glass fibers such as at least one of E glass fibers, S glass fibers, or D glass fibers. The thermally stable fibers can comprise polymer-based fibers such as high temperature polymer fibers. The polymer-based fibers can comprise a liquid crystal polymer such as VECTRAN commercially available from Kuraray America Inc., Fort Mill, S.C. The polymer-based fibers can comprise at least one of polyetherimide fibers, polyether ketone fibers, polysulfone fibers, polyethersulfone fibers, polycarbonate fibers, or polyester fibers.

The printed circuit board substrate can comprise a plurality of uncoated boron nitride particles. The printed circuit board substrate can comprise a secondary inorganic filler, in particular a dielectric and/or flame retardant filler, in combination with the coated boron nitride particles. Secondary inorganic dielectric fillers include titanium dioxide (rutile and anatase), barium titanate, strontium titanate, silica (particles and hollow spheres) including fused amorphous silica, corundum, wollastonite, fiberglass, $Ba_2Ti_9O_{20}$, glass spheres, quartz, boron nitride, aluminum nitride, phosphorous compounds (e.g., flame retardant phosphorus-containing compounds), brominated compounds (e.g., flame retardant bromine-containing compounds), silicon carbide, beryllia, alumina, magnesia, mica, talcs, nanoclays, aluminosilicates (natural and synthetic), and fumed silicon dioxide (e.g., CAB-O-SIL, available from Cabot Corporation). Other secondary fillers can be used, for example, magnesium hydroxide. Combinations of the secondary dielectric fillers can also be used. More specifically, rutile titanium dioxide and amorphous silica are especially desirable because these fillers have a high and low permittivities, respectively, thereby permitting a broad range of permittivities (for example of combined with a low dielectric loss to be achieved in the final cured product by adjusting the respective amounts of the two secondary dielectric fillers in the printed circuit board substrate. Specific dielectric fillers include rutile titanium dioxide and amorphous silica. The secondary fillers can be in the form of solid, porous, or hollow particles. Secondary fillers, when used, can be present in an amount of 15 to 60 vol %, or 20 to 50 vol % based on the total volume of the printed circuit board substrate.

The printed circuit board substrate can comprise a particulate fluoropolymer. Exemplary particulate fluoropolymers include, but are not limited to fluorinated homopolymers, for example, polytetrafluoroethylene (PTFE), and fluorinated copolymers, e.g., copolymers of tetrafluoroethylene with hexafluoropropylene or perfluoroalkylvinylethers such as perfluorooctylvinyl ether, or copolymers of tetrafluoroethylene with ethylene. Combinations of fluorinated polymers, copolymers, and terpolymers can also be used. The fluoropolymers can be in the form of a fine powder, dispersion, or granular form, including fine powder (or "coagulated dispersion") PTFE, made by coagulation and drying of dispersion-manufactured PTFE, generally manufactured to exhibit a particle size of 400 to 500 micrometers; granular PTFE made by suspension polymerization, generally having two different particle size ranges (median particle size of 30 to 40 micrometers for the standard product, and 400 to 500 micrometers for the high bulk density product); and/or granular PTFE, fluorinated ethylene-propylene copolymer (FEP), or a copolymer having a tetrafluoroethylene backbone with a fully fluorinated alkoxy side chain (PFA). The granular fluoropolymers can be cryogenically ground to exhibit a median particle size of less than 100 micrometers.

When present, the effective particulate fluoropolymer content of the printed circuit board substrate can be readily determined by one of ordinary skill in the art, depending upon the desired flame retardancy of the composition, the amount of the other components, and the other properties desired in the final product. More particularly, the amount of the fluoropolymer depends upon the amounts of the coated boron nitride particles, and other fillers and particulate flame retardants in the printed circuit board substrate. In general, effective quantities are 1 to 90 parts by weight per hundred parts by weight of thermoset polymer matrix (phr), or 5 to 75 phr, or 10 to 50 phr.

The polymer matrix can comprise at least one of an epoxy, a polyphenylene ether, polystyrene, an ethylene-propylene dicyclopentadiene copolymer, a polybutadiene, a polyisoprene, a fluoropolymer, poly(ether ether ketone), a polyimide, or a crosslinked matrix comprising at least one of triallyl cyanurate, triallyl isocyanurate, 1,2,4-trivinyl cyclohexane, trimethylolpropane triacrylate, or trimethylolpropane trimethacrylate. The thermoset polymer matrix can comprise a least one of an epoxy, polybutadiene, or polyisoprene. The polymer matrix can comprise a polyphenylene ether thermoset such as OPE-2ST 1200 or OPE-2ST 2200 (commercially available from Mitsubishi Gas Chemical Co.) or NORYL SA9000 (commercially available from SABIC Innovative Plastics). The polymer matrix can comprise an ethylene-propylene dicyclopentadiene copolymer. The thermoset resin contain a crosslinked matrix comprising a derivative of a crosslinker such as at least one of triallyl cyanurate, triallyl isocyanurate, 1,2,4-trivinyl cyclohexane, trimethylolpropane triacrylate, or trimethylolpropane trimethacrylate. The polymer matrix can comprise a thermoplastic resin such as at least one of a fluoropolymer, a poly(arylene ether ketone) (for example, poly(ether ether ketone (PEEK) or poly(ether ketone ketone) (PEKK)), or a polyimide (for example, a polyetherimide (PEI) such as ULTEM commercially available from SABIC Innovative Plastics). The thermoset can comprise an epoxy.

"Fluoropolymers" as used herein include homopolymers and copolymers that comprise repeat units derived from a fluorinated alpha-olefin monomer, i.e., an alpha-olefin monomer that includes at least one fluorine atom substituent, and optionally, a non-fluorinated, ethylenically unsaturated monomer reactive with the fluorinated alpha-olefin monomer. Exemplary fluorinated alpha-olefin monomers include $CF_2=CF_2$, $CHF=CF_2$, $CH_2=CF_2$, $CHCl=CHF$, $CClF=CF_2$, $CCl_2=CF_2$, $CClF=CClF$, $CHF=CCl_2$, $CH_2=CClF$, $CCl_2=CClF$, $CF_3CF=CF_2$, $CF3CF=CHF$, $CF_3CH=CF_2$, $CF_3CH=CH_2$, $CHF_2CH=CHF$, and $CF_3CH=CH_2$, and perfluoro($C_{2-8}$ alkyl)vinylethers such as perfluoromethyl vinyl ether, perfluoropropyl vinyl ether, and perfluorooctylvinyl ether. In some embodiments, the fluorinated alpha-olefin monomer comprises at least one of tetrafluoroethylene ($CF_2=CF_2$), chlorotrifluoroethylene ($CClF=CF_2$), (perfluorobutyl)ethylene, vinylidene fluoride ($CH_2=CF_2$), or hexafluoropropylene ($CF_2=CFCF_3$). Exemplary non-fluorinated monoethylenically unsaturated monomers include ethylene, propylene, butene, and ethylenically unsaturated aromatic monomers such as styrene and alpha-methyl-styrene. Exemplary fluoropolymers include poly(chlorotrifluoroethylene) (PCTFE), poly(chlorotrifluoroethylene-propylene), poly(ethylene-tetrafluoroethylene) (ETFE), poly(ethylene-chlorotrifluoroethylene) (ECTFE), poly(hexafluoropropylene), poly(tetrafluoroethylene) (PTFE), poly(tetrafluoroethylene-ethylene-propylene), poly(tetrafluoroethylene-hexafluoropropylene) (also known as fluorinated ethylene-propylene copolymer (FEP)), poly(tetrafluoroethylene-propylene) (also known as fluoroelastomer) (FEPM), poly(tetrafluoroethylene-perfluoropropylene vinyl ether), a copolymer having a tetrafluoroethylene backbone with a fully fluorinated alkoxy side chain (also known as a perfluoroalkoxy polymer (PFA)) (for example, poly (tetrafluoroethylene-perfluoroproplyene vinyl ether)), polyvinylfluoride (PVF), polyvinylidene fluoride (PVDF), poly (vinylidene fluoride-chlorotrifluoroethylene), perfluoropolyether, perfluorosulfonic acid, or perfluoropolyoxetane, preferably perfluoroalkoxy alkane polymer, or fluorinated ethylene-propylene, more preferably perfluoroalkoxy alkane polymer. A combination comprising at least one of the foregoing fluoropolymers can be used. In some embodiments the fluoropolymer is FEP, PFA, ETFE, or PTFE, which can be fibril forming or non-fibril forming. FEP is available under the trade TEFLON FEP from DuPont or NEOFLON FEP from Daikon; and PFA is available under the trade name NEOFLON PFA from Daikin, TEFLON PFA from DuPont, or HYFLON PFA from Solvay Solexis.

The thermoset can comprise at least one of a homopolymer or a copolymer comprising units derived from at least one of butadiene or isoprene. Units derived from other copolymerizable monomers can also be present in the thermoset polymer, for example, in the backbone of the polymer or in the form of grafts. Copolymerizable monomers include, but are not limited to, vinylaromatic monomers, for example, substituted and unsubstituted monovinylaromatic monomers such as at least one of styrene, 3-methylstyrene, 3,5-diethylstyrene, 4-n-propylstyrene, alpha-methylstyrene, alpha-methyl vinyltoluene, para-hydroxystyrene, para-methoxystyrene, alpha-chlorostyrene, alpha-bromostyrene, dichlorostyrene, dibromostyrene, tetra-chlorostyrene, or the like; and substituted and unsubstituted divinylaromatic monomers such as divinylbenzene, divinyltoluene, or the like. Combinations comprising at least one of the foregoing copolymerizable monomers can also be used. The thermoset polymer matrix can comprise, but is not limited to, at least one of epoxy resins, butadiene homopolymers, isoprene homopolymers, butadiene-vinylaromatic copolymers such as butadiene-styrene, isoprene-vinylaromatic copolymers such as isoprene-styrene copolymers, or the like.

The polybutadiene and/or polyisoprene can be present in the thermoset polymer matrix in an amount of up to 100 wt %, or up to 75 wt %, or 10 to 70 wt %, or 20 to 60 or 70 wt % with respect to the total weight of the thermoset polymer matrix (minus any filler or reinforcing layer). The thermoset polymer matrix can have at least 90 wt % 1,2 addition based on the total repeat units, which can exhibit greater crosslink density upon cure due to the large number of pendent vinyl groups available for crosslinking.

Other polymers that can co-cure with the thermoset polymer matrix can be present for specific property or processing modifications. For example, in order to improve the stability of the dielectric strength and mechanical properties of the electrical substrate material over time, a lower molecular weight ethylene-propylene elastomer can be used. An ethylene-propylene elastomer as used herein is a copolymer such as a terpolymer, or other polymer comprising primarily ethylene and propylene. Ethylene-propylene elastomers can be further classified as EPM copolymers (i.e., copolymers of ethylene and propylene monomers) or EPDM terpolymers (i.e., terpolymers of ethylene, propylene, and diene monomers). Ethylene-propylene-diene terpolymer rubbers, in particular, have saturated main chains, with unsaturation available off the main chain for facile crosslinking. Liquid ethylene-propylene-diene terpolymer rubbers, in which the diene is dicyclopentadiene, can be used.

The molecular weights of the ethylene-propylene rubbers can be less than or equal to 10,000 grams per mole (g/mol) viscosity average molecular weight (Mv). The ethylene-propylene rubber can have a weight average molecular weight (Mw) of less than or equal to 50,000 g/mol as measured by gel permeation chromatography based on polycarbonate standards. The ethylene-propylene rubber can include an ethylene-propylene rubber having an Mv of 7,200 g/mol, which is available from Lion Copolymer, Baton Rouge, La., under the trade name TRILENE CP80; a liquid ethylene-propylene-dicyclopentadiene terpolymer rubber having an Mv of 7,000 g/mol, which is available from Lion Copolymer under the trade name of TRILENE 65; and a liquid ethylene-propylene-ethylidene norbornene terpolymer having an Mv of 7,500 g/mol, which is available from Lion Copolymer under the name TRILENE 67.

The ethylene-propylene rubber can be present in an amount effective to maintain the stability of the properties of the substrate material over time, in particular the dielectric strength and mechanical properties. Typically, such amounts are up to 20 wt %, or 4 to 20 wt %, or 6 to 12 wt % with respect to the total weight of the thermoset polymer matrix.

Another type of co-curable polymer is an unsaturated polybutadiene- or polyisoprene-containing elastomer. This component can be a random or block copolymer of primarily 1,3-addition butadiene or isoprene with an ethylenically unsaturated monomer, for example, a vinylaromatic compound such as styrene or alpha-methyl styrene, an acrylate or methacrylate such a methyl methacrylate, or acrylonitrile. The elastomer can be a solid, thermoplastic elastomer comprising a linear or graft-type block copolymer having a polybutadiene or polyisoprene block and a thermoplastic block that can be derived from a monovinylaromatic monomer such as styrene or alpha-methyl styrene. Block copolymers of this type include styrene-butadiene-styrene triblock copolymers, for example, those available from Dexco Polymers, Houston, Tex. under the trade name VECTOR 8508M, from Enichem Elastomers America, Houston, Tex. under the trade name SOL-T-6302, and those from Dynasol Elastomers under the trade name CALPRENE 401; and styrene-butadiene diblock copolymers and mixed triblock and diblock copolymers containing styrene and butadiene, for example, those available from Kraton Polymers (Houston, Tex.) under the trade name KRATON D1118. KRATON D1118 is a mixed diblock/triblock styrene and butadiene containing copolymer that contains 33 wt % styrene based on the total weight of the copolymer.

The optional polybutadiene- or polyisoprene-containing elastomer can further comprise a second block copolymer similar to that described above, except that the polybutadiene or polyisoprene block is hydrogenated, thereby forming a polyethylene block (in the case of polybutadiene) or an ethylene-propylene copolymer block (in the case of polyisoprene). When used in conjunction with the above-described copolymer, materials with greater toughness can be produced. An example of a second block copolymer of this type is KRATON GX1855 (commercially available from Kraton Polymers), which is believed to be a mixture of a styrene-high 1,2-butadiene-styrene block copolymer and a styrene-(ethylene-propylene)-styrene block copolymer.

The unsaturated polybutadiene- or polyisoprene-containing elastomer component can be present in the polymer matrix composition in an amount of 2 to 60 wt %, or 5 to 50 wt %, or 10 to 40 wt %, or 10 to 50 wt % with respect to the total weight of the thermoset polymer matrix.

Still other co-curable polymers that can be added for specific property or processing modifications include, but are not limited to, homopolymers or copolymers of ethylene such as polyethylene and ethylene oxide copolymers; natural rubber; norbornene polymers such as polydicyclopentadiene; hydrogenated styrene-isoprene-styrene copolymers and butadiene-acrylonitrile copolymers; unsaturated polyesters; and the like. Levels of these copolymers are generally less than or equal to 50 wt % of the total weigh of the thermoset polymer matrix.

Free radical-curable monomers can also be added for specific property or processing modifications, for example, to increase the crosslink density of the system after cure. Monomers that can be suitable crosslinking agents include, for example, di, tri-, or higher ethylenically unsaturated monomers such as divinyl benzene, trivinyl benzene, triallyl cyanurate, diallyl phthalate, and multifunctional acrylate monomers (e.g., SARTOMER polymers available from Sartomer USA, Newtown Square, Pa.), or combinations thereof, all of which are commercially available. The crosslinking agent, when used, can be present in the polymer matrix composition in an amount of up to 20 wt %, or 1 to 15 wt %, based on the total weight thermoset polymer matrix.

A curing agent can be added to a thermosetting composition prior to cure to accelerate the curing reaction of polyenes having olefinic reactive sites. Curing agents can comprise organic peroxides, for example, at least one of dicumyl peroxide, t-butyl perbenzoate, 2,5-dimethyl-2,5-di (t-butyl peroxy)hexane, α,α-di-bis(t-butyl peroxy)diisopropylbenzene, or 2,5-dimethyl-2,5-di(t-butyl peroxy) hexyne-3. Carbon-carbon initiators, for example, 2,3-dimethyl-2,3-diphenylbutane can be used. Curing agents or initiators can be used alone or in combination. The amount of curing agent can be 1.5 to 10 wt % based on the total weight of the thermoset polymer matrix.

The thermoset polymer matrix can also be modified. For example, the thermoset polymer matrix can be carboxylate-terminated, hydroxyl-terminated, methacrylate-terminated, or the like. Post-reacted polymers can be used, such as epoxy-, maleic anhydride-, or urethane-modified polymers of butadiene or isoprene polymers. The thermoset polymer matrix can also be crosslinked, for example, by divinylaromatic compounds such as divinyl benzene, e.g., a polybutadiene-styrene crosslinked with divinyl benzene. Polymers are broadly classified as "polybutadienes" by their manufacturers, for example, Nippon Soda Co., Tokyo, Japan, and Cray Valley Hydrocarbon Specialty Chemicals, Exton, Pa. Mixtures of polymers can also be used, for example, a mixture of a polybutadiene homopolymer and a poly(butadiene-isoprene) copolymer. Combinations comprising a syndiotactic polybutadiene can also be useful.

The thermoset polymer matrix can be carboxy-functionalized. Functionalization can be accomplished using a polyfunctional compound having in the molecule both (i) a carbon-carbon double bond or a carbon-carbon triple bond, and (ii) at least one of a carboxy group, including a carboxylic acid, anhydride, amide, ester, or acid halide. A specific carboxy group is a carboxylic acid or ester. Examples of polyfunctional compounds that can provide a carboxylic acid functional group include maleic acid, maleic anhydride, fumaric acid, and citric acid. In particular, polybutadienes adducted with maleic anhydride can be used in the thermosetting composition. Suitable maleinized polybutadiene polymers are commercially available, for example, from Cray Valley under the trade names RICON 130MA8, RICON 130MA13, RICON 130MA20, RICON 131MA5, RICON 131MA10, RICON 131MA17, RICON 131MA20, and RICON 156MA17. Suitable maleinized polybutadiene-styrene copolymers are commercially available, for example, from Sartomer under the trade names RICON 184MA6 (a butadiene-styrene copolymer adducted with maleic anhydride having styrene content of 17 to 27 wt % and a number averaged molecular weight (Mn) of 9,900 g/mol).

The relative amounts of the various polymers in the thermoset polymer matrix, for example, the polybutadiene or polyisoprene polymer and other polymers, can depend on the particular conductive metal layer used, the desired properties of the circuit materials and copper clad laminates, and like considerations. For example, use of a poly(arylene ether) can provide increased bond strength to the conductive metal layer, for example, copper. Use of a polybutadiene and/or polyisoprene can increase high temperature resistance of the laminates, for example, when these polymers are carboxy-functionalized. Use of an elastomeric block copolymer can function to compatibilize the components of the polymer matrix. Determination of the appropriate quantities of each component can be done without undue experimentation, depending on the desired properties for a particular application.

In general, the printed circuit board substrate can be prepared by first mixing all the components, for example, including the monomer(s), the coated boron nitride particles, an optional secondary filler, an optional coupling agent (e.g., such as at least one of a silane, a zirconate, or a titanate), an optional solvent, and an optional curing agent). The mixing can continue to form a slurry or dispersion, wherein the respective components are uniformly dispersed throughout the mixture. For those applications where the mixture is impregnated on a reinforcing layer to form a prepreg, conventional prepreg manufacturing methods can be employed. Typically, the reinforcing layer is impregnated with the mixture, metered to the correct thickness, and then any solvent removed to form the prepreg. If the prepreg contains certain thermosetting polymers, it can then optionally be B-staged to form a partially cured layer before use in forming a circuit subassembly.

A solvent or dispersing medium can optionally be present to adjust the viscosity of the mixture. The solvent can be selected so as to dissolve or disperse the components of the mixture and to have a convenient evaporation rate for applying and drying the mixture, for example, on a reinforcing layer. A non-exclusive list of possible solvents and dispersing media includes at least one of water, xylene, toluene, methyl ethyl ketone, methyl isobutyl ketone, hexane, or higher liquid linear alkanes, such as heptane, octane, nonane, cyclohexane, isophorone, or various terpene-based solvents. Specific solvents and dispersing media for thermosetting compositions can include at least one of xylene, toluene, methyl ethyl ketone, methyl isobutyl ketone, or hexane, and more specifically, at least one of xylene or toluene.

Figure 2:
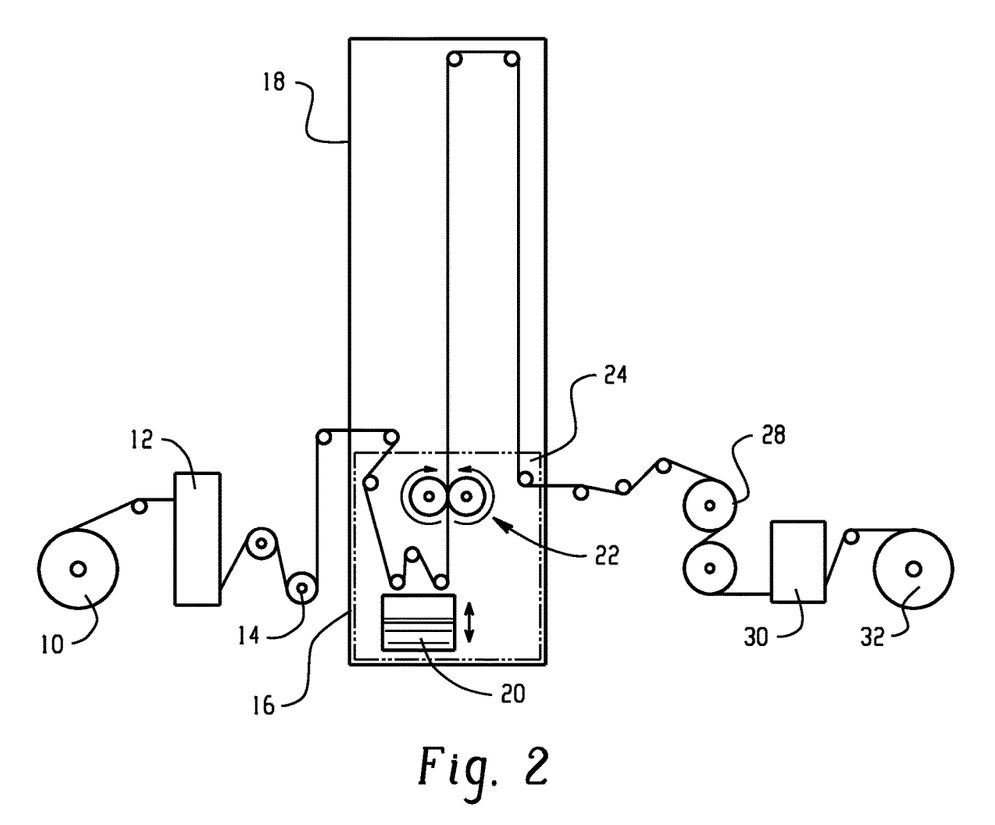
FIG. 2 is an illustration of an embodiment of a method of preparing the printed circuit board substrate.

FIG. 2 is an illustration of a method of preparing the printed circuit board substrate. FIG. 2 illustrates that a reinforcing layer is unwound from roll 10, passes through accumulator 12, and into coating area 16. In coating area 16, the coating mixture in tank 20 is raised such that the reinforcing layer traverses through the coating mixture to cover the reinforcing layer with the coating mixture. The reinforcing layer then traverses through metering rolls 22 to help ensure even coating of the coating mixture onto the reinforcing layer. After coating, the reinforcing layer traverses through the drying tower 18 to help evaporate any solvent present and to at least partially cure the polymer matrix. Finally, the reinforcing layer traverses around drive rolls 28, through accumulator 30, and ultimately onto coated roll 32. It is understood that many variations on this coating procedure can be performed and that this illustration is merely provided as a non-limiting embodiment of a coating method.

An article can comprise the printed circuit board substrate. The article can be a bond ply, cover film, or build-up material, and which, when combined with a conductive layer, can provide a circuit laminate, a resin-coated cap layer, or a circuit subassembly. A circuit material can comprise the printed circuit board substrate having a conductive layer disposed on one or both broad surfaces. Useful conductive layers include, for example, at least one of stainless steel, copper, gold, silver, aluminum, zinc, tin, lead, or a transition metal. There are no particular limitations regarding the thickness of the conductive layer, nor are there any limitations as to the shape, size, or texture of the surface of the conductive layer. The conductive layer can have a thickness of 3 to 200 micrometers, or 9 to 180 micrometers. When two or more conductive layers are present, the thickness of the two layers can be the same or different. The conductive layer can comprise a copper layer. Suitable conductive layers include a thin layer of a conductive metal such as a copper foil presently used in the formation of circuits, for example, electrodeposited copper foils. The copper foil can have a root mean squared (RMS) roughness of less than or equal to 2 micrometers, or less than or equal to 0.7 micrometers, where roughness is measured using a Veeco Instruments WYCO Optical Profiler, using the method of white light interferometry.

The conductive layer can be applied by placing the conductive layer in a mold prior to reaction injection molding, by laminating the conductive layer onto the printed circuit board substrate, by direct laser structuring, or by adhering the conductive layer to the printed circuit board substrate via an adhesive layer. Other methods known in the art can be used to apply the conductive layer where permitted by the particular materials and form of the circuit material, for example, electrodeposition, chemical vapor deposition, and the like.

The laminating can entail laminating a multilayer stack comprising the printed circuit board substrate, a conductive layer, and an optional intermediate layer between the printed circuit board substrate and the conductive layer to form a layered structure. The conductive layer can be in direct contact with the printed circuit board substrate, without the intermediate layer. The layered structure can then be placed in a press, e.g., a vacuum press, under a pressure and temperature and for duration of time suitable to bond the layers and form a laminate. Lamination and optional curing can be by a one-step process, for example, using a vacuum press, or can be by a multi-step process. In a one-step process, the layered structure can be placed in a press, brought up to laminating pressure (e.g., 150 to 2,500 pounds per square inch (psi) [1 to 17 megapascal]) and heated to laminating temperature (e.g., 150 to 390° C.). The laminating temperature and pressure can be maintained for a desired soak time, i.e., 20 minutes, and thereafter cooled (while still under pressure) to less than or equal to 150° C.

If present, the intermediate layer can comprise a polyfluorocarbon film that can be located in between the conductive layer and the substrate layer, and an optional layer of microglass reinforced fluorocarbon polymer can be located in between the polyfluorocarbon film and the conductive layer. The layer of microglass reinforced fluorocarbon polymer can increase the adhesion of the conductive layer to the substrate. The microglass can be present in an amount of 4 to 30 wt % based on the total weight of the layer. The microglass can have a longest length scale of less than or equal to 900 micrometers, or less than or equal to 500 micrometers. The microglass can be microglass of the type as commercially available by Johns-Manville Corporation of Denver, Colo. The polyfluorocarbon film comprises a fluoropolymer (such as polytetrafluoroethylene (PTFE), a fluorinated ethylene-propylene copolymer (such as Teflon FEP), and a copolymer having a tetrafluoroethylene backbone with a fully fluorinated alkoxy side chain (such as Teflon PFA)).

The conductive layer can be applied by laser direct structuring. Here, the printed circuit board substrate can comprise a laser direct structuring additive; and the laser direct structuring can comprise using a laser to irradiate the surface of the substrate, forming a track of the laser direct structuring additive, and applying a conductive metal to the track. The laser direct structuring additive can comprise a metal oxide particle (such as titanium oxide and copper chromium oxide). The laser direct structuring additive can comprise a spinel-based inorganic metal oxide particle, such as spinel copper. The metal oxide particle can be coated, for example, with a composition comprising tin and antimony (for example, 50 to 99 wt % of tin and 1 to 50 wt % of antimony, based on the total weight of the coating). The laser direct structuring additive can comprise 2 to 20 parts of the additive based on 100 parts of the respective composition. The irradiating can be performed with a YAG laser having a wavelength of 1,064 nanometers under an output power of 10 Watts, a frequency of 80 kilohertz (kHz), and a rate of 3 meters per second. The conductive metal can be applied using a plating process in an electroless plating bath comprising, for example, copper.

The conductive layer can be applied by adhesively applying the conductive layer. The conductive layer can be a circuit (the metallized layer of another circuit), for example, a flex circuit. An adhesion layer can be disposed between one or more conductive layers and the substrate. When appropriate, the adhesion layer can comprise a poly(arylene ether); and a carboxy-functionalized polybutadiene or polyisoprene polymer comprising butadiene, isoprene, or butadiene and isoprene units, and 0 to 50 wt % of co-curable monomer units. The adhesive layer can be present in an amount of 2 to 15 grams per square meter. The poly(arylene ether) can comprise a carboxy-functionalized poly(arylene ether). The poly(arylene ether) can be the reaction product of a poly(arylene ether) and a cyclic anhydride or the reaction product of a poly(arylene ether) and maleic anhydride. The carboxy-functionalized polybutadiene or polyisoprene polymer can be a carboxy-functionalized butadiene-styrene copolymer. The carboxy-functionalized polybutadiene or polyisoprene polymer can be the reaction product of a polybutadiene or polyisoprene polymer and a cyclic anhydride. The carboxy-functionalized polybutadiene or polyisoprene polymer can be a maleinized polybutadiene-styrene or maleinized polyisoprene-styrene copolymer.

The following examples are provided to illustrate the present disclosure. The examples are merely illustrative and are not intended to limit devices made in accordance with the disclosure to the materials, conditions, or process parameters set forth therein.

EXAMPLES

In the examples, the copper peel strength is measured in accordance with IPC-TM-650-2.4.8 after thermal stress involving a 10 second exposure to molten solder at 288° C. The relative permittivity and dielectric loss were measured in accordance with IPC-TM-650-2.5.5.5. The dielectric strength was measured in accordance with IPC-TM-650-2.5.6.2. The water absorption was measured in accordance with ASTM D570-98(2018) using a test specimen having a nominal thickness of 1.52 millimeters after 48 hours of immersion at 50° C. The thermal conductivity is the Z-direction thermal conductivity measured in accordance with ASTM D5470-17, TIM Tester 1300.

Examples 1-6: Effect of Coating Thickness on Coated Hexagonal Boron Nitride

The surfaces of particles of hexagonal boron nitride were coated with aluminum oxide by atomic layer deposition (ALD) using trimethylaluminum and water as precursors. The boron nitride powder used was PBN20, high density agglomerates of hexagonal boron nitride platelets, supplied by Zibo Jonye Ceramics Technology Company. PBN20 exhibits a typical median particle size of 18 to 22 micrometers and a specific surface area of 6.2 meters squared per gram ($m^2/g$). A series of coated powders were produced with different coating thicknesses by stepwise changes in the number of ALD cycles. The aluminum content of the coated powders was determined by ICP analyses, and the surface energies were measured by the Washburn wicking method for contact angle with different probe liquids. The contact angle measurements were combined with Fowkes theory to resolve the surface energies into dispersive and polar components. The results are shown in Table 1, FIG. 3, and FIG. 4, where $mJ/m^2$ and mJ/sqm stand for millijoules per meter squared and ppm stands for parts per million by weight based on the total weight of the samples.

TABLE 1

|  | Example | | | | | |
| --- | --- | --- | --- | --- | --- | --- |
|  | 1 | 2 | 3 | 4 | 5 | 6 |
| Number of cycles | 0 | 4 | 4 | 6 | 10 | 20 |
| Aluminum content (ppm) | 25 | 3,467 | 2,950 | 4,275 | 6,462 | 14,482 |

TABLE 1-continued

|  | Example | | | | | |
| --- | --- | --- | --- | --- | --- | --- |
|  | 1 | 2 | 3 | 4 | 5 | 6 |
| Moisture content (ppm) | 1,430 | 1,020 | 488 | 493 | 311 | 370 |
| Overall surface energy (mJ/m$^2$) | 28.03 | 35.64 | 33.38 | 37.11 | 38.40 | 40.93 |
| Polar surface energy (mJ/m$^2$) | 2.90 | 9.14 | 6.89 | 10.78 | 12.07 | 14.65 |
| Dispersive surface energy (mJ/m$^2$) | 25.13 | 26.50 | 26.49 | 26.33 | 26.33 | 26.28 |
| Surface Polarity (%) | 10.3 | 25.6 | 20.6 | 29.0 | 31.4 | 35.8 |
| Diiodomethane contact angle (degrees) | 66.0 | 63.6 | 63.6 | 63.9 | 63.9 | 64.0 |
| Water contact angle (degrees) | 88.5 | 73.0 | 77.4 | 70.2 | 68.0 | 63.9 |

Figure 3:
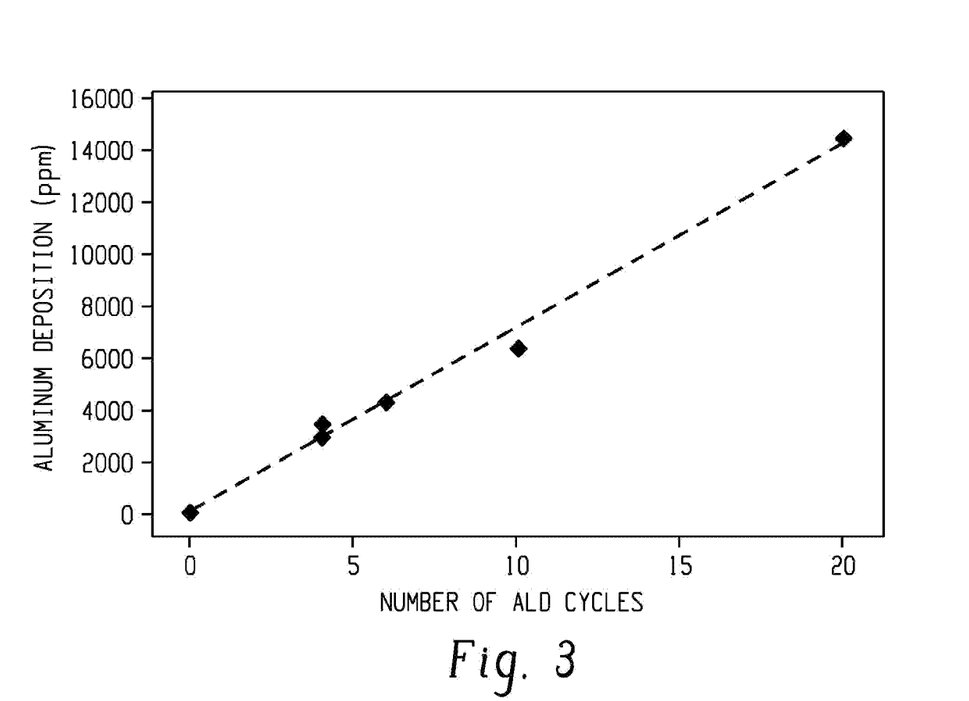
FIG. 3 is a graphical illustration of the aluminum concentration with number of cycles of Examples 1-6.

Table 1 and FIG. 3 show that the amount of aluminum deposited is well controlled through the number of ALD cycles. Without being bound by theory, it is believed that this self-regulation is due to the surface reactions, involving trimethylaluminum and water being self-limiting.

Figure 4:
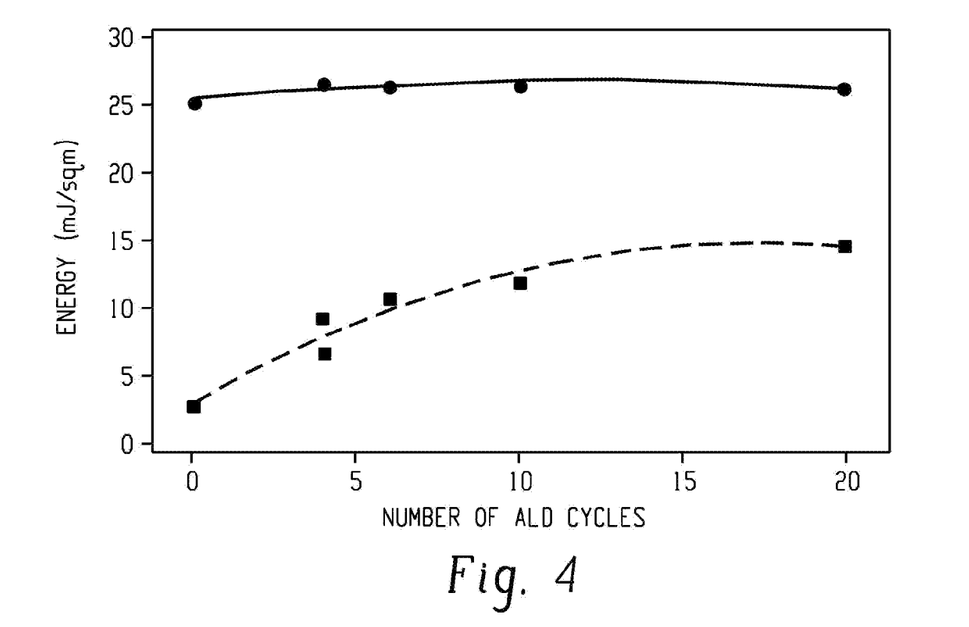
FIG. 4 is a graphical illustration of the surface energy with the number of cycles of Examples 1-6.

Table 1 and FIG. 4 show that the uncoated Example 1 exhibited the lowest overall surface energy, dispersive surface energy (top curve in FIG. 4) and surface polarity (bottom curve in FIG. 4). The surface polarity of uncoated boron nitride is believed to be essentially due to boron oxides present on the surface. It can be seen that the coating provides a method for modifying the surface polarity of the boron nitride filler. The increase in surface polarity is likely attributable to the presence of hydroxyl groups on the surface of the coating.

Example 7: Printed Circuit Board Substrate Containing a Coated Boron Nitride A printed circuit board substrate was prepared comprising 15 vol % of a coated boron nitride and 85 vol % of RO4000 (commercially available from Rogers Corporation), both based on the total volume of the substrate minus the glass fiber reinforcing layer. The coated boron nitride was prepared by coating a boron nitride powder (Momentive PT-120) with 10 cycles of ALD coating of aluminum oxide. The thickness of the aluminum oxide coating was 5 nm. The thermal conductivity and peel strength are shown in Table 2.

Example 8: Printed Circuit Board Substrate Containing an Uncoated Boron Nitride A printed circuit board substrate was prepared comprising 15 vol % of an uncoated boron nitride and 85 vol % of RO4000 (commercially available from Rogers Corporation). The uncoated boron nitride was Momentive PT-100. The thermal conductivity and peel strength are shown in Table 2.

TABLE 2

|  | Example | |
| --- | --- | --- |
|  | 7 | 8 |
| Coated boron nitride | Y | N |
| Thermal Conductivity (W/mK) | 0.84-0.94 | 0.89-0.95 |
| Peel Strength (pli (kg/cm)) | 3.5 (0.63) | 2.1 (0.38) |

Table 2 shows that the peel strength of the printed circuit board substrate of Example 7 comprising the coated boron nitride was significantly improves as compared to the printed circuit board substrate of Example 8 comprising the same amount of boron nitride but that was uncoated.

Examples 9-11: Effect of Coated Boron Nitride in Multilayer Composites

Dielectric substrates, containing 17.3 vol % of PBN20 and 27.6 vol % of fused amorphous silica particles, were produced with 1674-style woven glass fabric using a conventional solution prepregging process. Prepreg materials were made both with as-received boron nitride aggregates, and with aggregates that were coated with aluminum oxide using 4 ALD cycles (coating thickness of 0.4 nm). The nominal composition of the prepreg materials is shown in Table 3, where the polymer blend comprised of an admixture of 1,2-polybutadiene (NISSO-PB B-3000), in an amount sufficient to be the continuous phase, a butadiene-styrene block copolymer (KRATON D1118 ET), and an EPDM terpolymer (TRILENE 65).

TABLE 3

| Component | Amount (vol %) |
| --- | --- |
| Polymer blend | 32.01 |
| Flame retardant | 6.70 |
| Fused amorphous silica | 27.57 |
| Coated boron nitride | 17.25 |
| Silane coupling agent | 0.78 |
| Antioxidant | 0.29 |
| Organic peroxide | 0.59 |
| Woven glass fabric | 14.81 |

Multiple sheets of the resultant prepreg materials, with a nominal pressed thickness of 0.25 millimeters (mm) (0.010 inches), were stacked-up and laminated to 1.0 ounce per foot squared (305 grams per meter squared) electrodeposited copper foil in order to produce test panels of with nominal core thicknesses of 0.508 mm (0.020 inches) and 1.52 mm (0.060 inches). A summary of the properties of Examples 9 and 10 comprising uncoated boron nitride and coated boron nitride, respectively, is shown in Table 4, where kV/cm stands for kilovolts per centimeter.

TABLE 4

|  | Example | |
| --- | --- | --- |
|  | 9 | 10 |
| Copper peel strength (pli (kg/cm)) | 4.28 (0.77) | 4.83 (0.86) |
| Relative permittivity at 10 GHz | 3.55 | 3.54 |
| Dielectric loss, tan δ at 10 GHz | 0.0027 | 0.0032 |
| Dielectric strength (volts per mil (kV/cm)) | 715 (0.28) | 855 (0.34) |

TABLE 4-continued

| | Example | |
|---|---|---|
| | 9 | 10 |
| Water absorption (wt %) | 0.21 | 0.08 |
| Z-direction thermal conductivity (W/mK) | 1.02 | 1.01 |

Table 4 shows that Example 10 comprising the coated boron nitride had a greater dielectric breakdown strength and lower water absorption, indicating an improved filler to polymer interface. Table 4 also shows a lower water absorption relative of Example 9. This low water absorption is of particular importance, because printed circuit processes involve immersions in aqueous baths and the ingress of ionic materials can have deleterious effects on electrical performance. These benefits were obtained without a significant effect on the Z-direction thermal conductivity.

Figure 5:
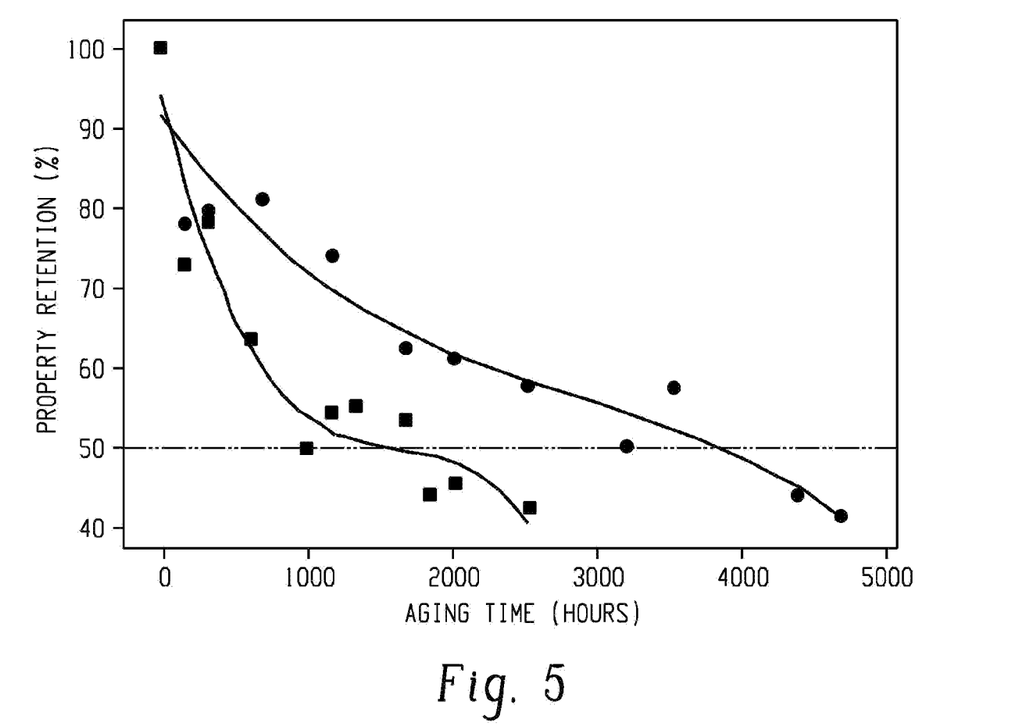
FIG. 5 is a graphical illustration of the dielectric strength with time of Examples 9 and 11.

In addition to the beneficial effects on dielectric strength and water absorption, the long-term resistance to thermooxidative degradation at elevated temperatures can be significantly improved through the use of coated boron nitride. FIG. 5 illustrates that the dielectric substrate of Example 11 containing the coated boron nitride exhibits a 4 fold increase in the half-life of dielectric strength upon continuous exposure to 200° C. Specifically, FIG. 5 shows that the half-lives of Example 9 comprising the uncoated boron nitride (lower curve) and Example 11 comprising a coated boron nitride at a thickness of 0.51 mm (0.020 inches) (higher curve), were 980 hours and 4,200 hours, respectively.

Set forth below are various non-limiting aspects of the disclosure.

Aspect 1A: A printed circuit board substrate comprising: a polymer matrix; a reinforcing layer; and a plurality of coated boron nitride particles; wherein the plurality of coated boron nitride particles comprise a coating having an average coating thickness of 0.5 to 100 nanometers, or 1 to 100 nanometers.

Aspect 1B: A printed circuit board substrate comprising: a polymer matrix, wherein the polymer matrix comprises at least one of an epoxy, a polyphenylene ether, polystyrene, an ethylene-propylene dicyclopentadiene copolymer, a polybutadiene, a polyisoprene, a fluoropolymer, or a crosslinked matrix comprising at least one of triallyl cyanurate, triallyl isocyanurate, 1,2,4-trivinyl cyclohexane, trimethylolpropane triacrylate, or trimethylolpropane trimethacrylate; a reinforcing layer; and a plurality of coated boron nitride particles; wherein the plurality of coated boron nitride particles comprise a coating having an average coating thickness of 0.5 to 100 nanometers, or 1 to 100 nanometers.

Aspect 1C: A printed circuit board substrate comprising: a thermoset polymer matrix comprising at least one of an epoxy, a polybutadiene, or a polyisoprene; a reinforcing layer; and a plurality of coated boron nitride particles; wherein the plurality of coated boron nitride particles comprise a coating having an average coating thickness of 0.5 to 100 nanometers, or 1 to 100 nanometers.

Aspect 2: The printed circuit board substrate of Aspect 1, wherein the plurality of coated boron nitride particles has an average particle size of 0.1 to 1,000 micrometers, or 5 to 500 micrometers, or 25 to 150 micrometers, or 3 to 40 micrometers.

Aspect 3: The printed circuit board substrate of any one or more of the preceding aspects, wherein the coating comprises at least one of an inorganic carbide, an inorganic oxide, an inorganic nitride, an inorganic sulfide, an inorganic hydroxide, or an inorganic phosphide. The inorganic hydroxide, if present can comprise at least one of aluminum hydroxide, zinc hydroxide, or silicon hydroxide.

Aspect 4: The printed circuit board substrate of any one or more of the preceding aspects, wherein the coating comprises at least one of silicon dioxide or aluminum oxide.

Aspect 5: The printed circuit board substrate of any one or more of the preceding aspects, wherein the thickness is 0.5 to 30 nm, or 1 to 20 nm, or less than or equal to 5 nm.

Aspect 6: The printed circuit board substrate of any one or more of the preceding aspects, wherein the coating is disposed over 10 to 100 A %, or 50 to 100 A %, or 90 to 100 A % of the surface of the plurality of the boron nitride particles.

Aspect 7: The printed circuit board substrate of any one or more of the preceding aspects, wherein the plurality of coated boron nitride particles comprises less than 1 wt %, or 0.001 to 0.9 wt %, or 0.001 to 0.5 wt %, or 0.005 to 0.1 wt % of the coating based on the total weight of the plurality of coated boron nitride particles.

Aspect 8: The printed circuit board substrate of any one or more of the preceding aspects, wherein the plurality of coated boron nitride particles comprises ALD coated particles.

Aspect 9: The printed circuit board substrate of any one or more of the preceding aspects, wherein the printed circuit board substrate comprises 1 to 85 vol %, or 1 to 50 vol %, or 5 to 35 vol %, or 10 to 25 vol % of the plurality of coated boron nitride particles based on the total volume of the printed circuit board substrate.

Aspect 10: The printed circuit board substrate of any one or more of the preceding aspects, wherein the printed circuit board substrate comprises 15 to 99 vol %, or 50 to 99 vol %, or 65 to 95 vol %, or 75 to 80 vol % of the thermoset polymer matrix based on the total volume of the printed circuit board substrate.

Aspect 11: The printed circuit board substrate of any one or more of the preceding aspects, wherein the reinforcing layer comprises a plurality of glass fibers.

Aspect 12: The printed circuit board substrate of any one or more of the preceding aspects, wherein the thermoset polymer matrix comprises at least one of an epoxy resin, a butadiene homopolymer, an isoprene homopolymer, a butadiene-vinylaromatic copolymer, or an isoprene-vinylaromatic copolymer. The thermoset polymer matrix can comprise the epoxy resin. The thermoset polymer matrix can comprise a polybutadiene. The thermoset polymer matrix can comprise a polyisoprene.

Aspect 13: The printed circuit board substrate of any one or more of the preceding aspects, wherein the printed circuit board substrate has a peel strength of greater than or equal to 3 pli as determined in accordance with IPC-TM-650-2.4.8.

Aspect 14: A circuit material comprising the printed circuit board substrate of any one or more of the preceding aspects and a conductive layer disposed on at least one surface of the printed circuit board substrate.

Aspect 15: A method of making the printed circuit board substrate of any one or more of the preceding aspects, comprising forming a mixture comprising a thermosetting composition and the plurality of the coated boron nitride particles; coating a reinforcing layer with the mixture; and curing the thermosetting composition to form the printed circuit board substrate.

Aspect 16: The method of Aspect 15, wherein the coating a reinforcing layer comprises at least one of dip coating, roll-over-knife coating, roll-to-roll coating, or the like.

Aspect 17: The method of Aspect 16, further wherein the coating the reinforcing layer comprises roll-to-roll coating the reinforcing layer with the mixture by first unrolling the reinforcing layer from a first roll, traversing the reinforcing layer through the mixture, traversing the reinforcing layer through a solvent drying section and at least partially curing the thermosetting mixture, and winding the coated reinforcing layer onto a second roll.

Aspect 18: The method of any one or more of Aspects 15 to 17, wherein the curing comprises partially curing to form a pre-preg.

Aspect 19: The method of any one or more of Aspects 15 to 18, further comprising depositing a conductive layer on at least one surface of the printed circuit board substrate.

Aspect 20: The method of any one or more of Aspects 15 to 19, further comprising depositing the coating on the plurality of boron nitride coated particles by atomic layer deposition prior to forming the mixture.

The compositions, methods, and articles can alternatively comprise, consist of, or consist essentially of, any appropriate materials, steps, or components herein disclosed. The compositions, methods, and articles can additionally, or alternatively, be formulated so as to be devoid, or substantially free, of any materials (or species), steps, or components, that are otherwise not necessary to the achievement of the function or objectives of the compositions, methods, and articles.

As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise. The term "or" means "and/or" unless clearly indicated otherwise by context. Reference throughout the specification to "an aspect", "an embodiment", "another embodiment", "some embodiments", and so forth, means that a particular element (e.g., feature, structure, step, or characteristic) described in connection with the embodiment is included in at least one embodiment described herein, and may or may not be present in other embodiments. In addition, it is to be understood that the described elements may be combined in any suitable manner in the various embodiments.

When an element such as a layer, film, region, or substrate is referred to as being "on" another element, it can be directly on the other element or intervening elements may also be present. In contrast, when an element is referred to as being "directly on" another element, there are no intervening elements present.

In general, the compositions, methods, and articles can alternatively comprise, consist of, or consist essentially of, any ingredients, steps, or components herein disclosed. The compositions, methods, and articles can additionally, or alternatively, be formulated, conducted, or manufactured so as to be devoid, or substantially free, of any ingredients, steps, or components not necessary to the achievement of the function or objectives of the present claims.

Unless specified to the contrary herein, all test standards are the most recent standard in effect as of the filing date of this application, or, if priority is claimed, the filing date of the earliest priority application in which the test standard appears.

The endpoints of all ranges directed to the same component or property are inclusive of the endpoints, are independently combinable, and include all intermediate points and ranges. For example, ranges of "up to 25 wt %, or 5 to 20 wt %" is inclusive of the endpoints and all intermediate values of the ranges of "5 to 25 wt %," such as 10 to 23 wt %, etc.

The term "combination" is inclusive of blends, mixtures, alloys, reaction products, and the like. Also, "at least one of" means that the list is inclusive of each element individually, as well as combinations of two or more elements of the list, and combinations of at least one element of the list with like elements not named.

Unless defined otherwise, technical and scientific terms used herein have the same meaning as is commonly understood by one of skill in the art to which this invention belongs.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

What is claimed is:

1. A printed circuit board substrate comprising:
   a polymer matrix, wherein the polymer matrix comprises at least one of an epoxy, a polyphenylene ether, a polystyrene, an ethylene-propylene dicyclopentadiene copolymer, a polybutadiene, a polyisoprene, a fluoropolymer, or a crosslinked matrix comprising at least one of triallyl cyanurate, triallyl isocyanurate, 1,2,4-trivinyl cyclohexane, trimethylolpropane triacrylate, or trimethylolpropane trimethacrylate;
   a reinforcing layer; and
   10 to 50 volume percent, based on the total volume of the printed circuit board substrate, of a plurality of coated boron nitride particles having an average particle size of 5 to 500 micrometers;
   wherein the plurality of coated boron nitride particles comprises a coating comprising aluminum oxide, wherein the coating has an average coating thickness of 0.5 to 10 nanometers, wherein the plurality of coated boron nitride particles further comprises a surface treatment;
   wherein the printed circuit board substrate has a peel strength of greater than or equl to 3 pli as determined in accordance with IPC-Tm-650-2,4,8; and
   wherein the printed circuit board has a Z-direction thermal conductivity that is at least 90% that of an equivalent printed circuit board comprising boron nitride particles without the coating comprising aluminum oxide.

2. The printed circuit board substrate of claim 1, wherein the plurality of coated boron nitride particles has an average particle size of 10 to 250 micrometers.

3. The printed circuit board substrate of claim 1, wherein the coating further comprises silicon dioxide.

4. The printed circuit board substrate of claim 1, wherein the average coating thickness is 1 to 10 nm.

5. The printed circuit board substrate of claim 1, wherein the coating is disposed over 10 to 100 A % of the total surface area of the plurality of the boron nitride particles.

6. The printed circuit board substrate of claim 1, wherein the plurality of coated boron nitride particles comprises less than 1 wt % of the coating based on the total weight of the plurality of coated boron nitride particles.

7. The printed circuit board substrate of claim 1, wherein the plurality of coated boron nitride particles comprises atomic layer deposition coated particles.

8. The printed circuit board substrate of claim 1, wherein the printed circuit board substrate comprises 10 to 25 vol % of the plurality of coated boron nitride particles based on the total volume of the printed circuit board substrate.

9. The printed circuit board substrate of claim 1, wherein the printed circuit board substrate comprises 15 to 99 vol % of the thermoset polymer matrix based on the total volume of the printed circuit board substrate.

10. The printed circuit board substrate of claim 1, wherein the reinforcing layer comprises a plurality of glass fibers.

11. The printed circuit board substrate of claim 1, wherein the polymer matrix comprises at least one of a butadiene homopolymer, an isoprene homopolymer, a butadiene-vinylaromatic copolymer, or an isoprene- vinylaromatic copolymer.

12. The printed circuit board substrate of claim 1, wherein the surface treatment comprises a coupling agent.

13. The printed circuit board substrate of claim 1, comprising, based on the total volume of the printed circuit board substrate:
    15 to 50 volume percent of the polymer matrix;
    10 to 25 volume percent of the plurality of coated boron nitride particles;
    20 to 50 volume percent of a secondary inorganic filler comprising
        a secondary inorganic dielectric filler, and
        a flame retardant filler; and
    the reinforcing layer.

14. The printed circuit board of claim 13, wherein:
    the polymer matrix comprises at least one of a polystyrene, an ethylene-propylene dicyclopentadiene copolymer, a polybutadiene, an epoxy, or a polyisoprene,
    the reinforcing layer comprises glass fibers;
    the plurality of coated boron nitride particles further comprise a surface treatment comprising a coupling agent; and
    the secondary inorganic dielectric filler comprises silica.

15. A circuit material comprising the printed circuit board substrate of claim 1 and a conductive layer disposed on at least one surface of the printed circuit board substrate.

16. A method of making the printed circuit board substrate of claim 1, comprising
    forming a mixture comprising a thermosetting composition and the plurality of the coated boron nitride particles;
    coating a reinforcing layer with the mixture; and
    curing the thermosetting composition to form the printed circuit board substrate.

17. The method of claim 16, wherein the reinforcing layer comprises a plurality of glass fibers.

18. The method of claim 17, further wherein the coating the reinforcing layer comprises roll-to-roll coating the reinforcing layer with the mixture by first unrolling the reinforcing layer from a first roll, traversing the reinforcing layer through the mixture, traversing the reinforcing layer through a solvent drying section and at least partially curing the thermosetting mixture, and winding the coated reinforcing layer onto a second roll.

19. The method of claim 16, wherein the curing comprises partially curing to form a pre-preg.

20. The method of claim 16, further comprising depositing a conductive layer on at least one surface of the printed circuit board substrate.

21. The method of claim 16, further comprising depositing the coating on the plurality of boron nitride coated particles by atomic layer deposition prior to forming the mixture.

* * * * *